(12) United States Patent
Maetani

(10) Patent No.: US 6,566,601 B2
(45) Date of Patent: May 20, 2003

(54) HIGH FREQUENCY SEMICONDUCTOR DEVICE HOUSING PACKAGE AND MOUNTING STRUCTURE FOR MOUNTING THE SAME

(75) Inventor: Maraki Maetani, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/107,540

(22) Filed: Mar. 26, 2002

(65) Prior Publication Data

US 2002/0166689 A1 Nov. 14, 2002

(30) Foreign Application Priority Data

Mar. 27, 2001 (JP) .................................. 2001-089754

(51) Int. Cl.⁷ ............................................. H01L 23/02
(52) U.S. Cl. ...................... 174/52.4; 174/261; 361/772; 361/777; 257/728
(58) Field of Search ............................... 174/52.4, 260, 174/261, 262, 263; 361/760, 767, 772, 773, 774, 777; 257/728, 773, 779, 786

(56) References Cited

U.S. PATENT DOCUMENTS 5,347,086 A * 9/1994 Potter et al. ................ 174/261
6,057,600 A * 5/2000 Kitazawa et al. ........... 257/728
6,239,385 B1 * 5/2001 Schwiebert et al. ........ 174/261

FOREIGN PATENT DOCUMENTS

| JP | 08-236655 | 9/1996 |
|----|-----------|--------|
| JP | 10-501102 | 1/1998 |
| JP | 10-178144 | 6/1998 |

* cited by examiner

Primary Examiner—Dean A. Reichard
Assistant Examiner—Carmelo Oliva
(74) Attorney, Agent, or Firm—Hogan & Hartson, LLP

(57) ABSTRACT

The invention is directed to a high frequency semiconductor device housing package comprising: an insulating substrate having on its top surface a high frequency semiconductor device mounting and housing portion; a plurality of wiring conductors delivered from the mounting and housing portion through the under surface of the insulating substrate, to which an electrode of the high frequency semiconductor device is electrically connected; and a plurality of ball-shaped signal terminals and ball-shaped grounding terminals arranged on the under surface of the insulating substrate and electrically connected to the wiring conductor, the ball-shaped grounding terminals being arranged substantially circularly so as to surround the centered ball-shaped signal terminal. This construction achieves efficient transmission of high-frequency signals because of its excellent high frequency characteristics in the ball-shaped terminals. It also excels in easiness of mass production and mounting accuracy.

21 Claims, 5 Drawing Sheets

HIGH FREQUENCY SEMICONDUCTOR DEVICE HOUSING PACKAGE AND MOUNTING STRUCTURE FOR MOUNTING THE SAME

BACKGROUND OF THE INVENTION

1. Field of the Invention

The present invention relates to a ball grid array-type high frequency semiconductor device housing package for mounting and housing therein a high frequency semiconductor device for use in, for example, a microwave or millimeter wave region, and to a mounting structure for mounting the same. More particularly, the invention relates to a high frequency semiconductor device housing package that provides improved efficiency of high frequency signal transmission and also provides high mounting yields, and to a mounting structure for mounting the same.

2. Description of the Related Art

Conventionally, a high frequency semiconductor device housing package for use in a high-frequency range such as a microwave or millimeter wave region is constructed as follows. For example, on a base substrate made of metal is placed a metallic frame body and the like to constitute a wall portion. The metallic frame body constituting the wall portion has a notch formed in one part thereof. In this notch portion is provided an input/output terminal by fitting and bonding that has a line-conversion structure constituted by a combination of micro-strip line/strip line (triplate line)/ micro strip line, which is obtained by stacking dielectric layers one on top of another. Then, after a semiconductor circuit device for use in a high-frequency range is mounted within the package, a lid body made of metal or a dielectric material is attached thereon by soldering, welding, or other techniques.

Moreover, in such a high frequency semiconductor device housing package, the input/output terminal, acting as an interface between the semiconductor circuit device housed therewithin and an external electric circuit is commonly shaped as a planar circuit, like a micro-strip line. Thus, for establishing connection with the external electric circuit, on a ground surface having a flat plane, like a bottom surface of a metal chassis, are arranged the circuit board of the external electric circuit and the input/output terminal which is designed to be possibly uniform in height with the circuit board, and their strip lines are connected to one another by a gold wire or the like. In a case where it is difficult to make the circuit board and the input/output terminal uniform in height, their strip lines are mutually connected by wire bonding with the difference in height left between the circuit board and the input/output terminal. Otherwise, if possible, wire bonding is carried out after the ground surface is suitably processed so that the input/output terminal is possibly uniform in surface height with the circuit board.

However, the above-described conventional high frequency semiconductor device housing package has the following disadvantage. In a high-frequency range, in particular a millimeter wave region, in order to suppress occurrence of unnecessary mode in signal transmission, the constituent components need to be made as small as possible in dimension. As a result, formation of a notch in the wall portion, fabrication of the input/output terminal, or assembling process for these components need to be performed with remarkably high accuracy. This makes difficult the manufacture of the high frequency semiconductor device housing package, and thus leads to an undesirable increase in the manufacturing cost.

There arises another problem involved in the connection with the external electric circuit. In a high-frequency band such as a millimeter wave region, if wire bonding is carried out with the difference in height left in the mounting surface, the transmission characteristics are deteriorated. Even in a case where the ground surface is suitably processed, the discontinuity of the height of the ground surface can lead to deterioration in the transmission characteristics. Still another problem is that, likewise to the above, the hollowing of the bottom surface of the chassis or other processing needs to be achieved with remarkably high accuracy.

Further, a problem is encountered also in the operation for mounting the high frequency semiconductor device housing package with respect to the circuit board. The input/output terminal and the external electric circuit need to be positioned relative to each other by butting with high accuracy, and this makes the mounting operation difficult.

As a consequence, there is an increasing demand for such a high frequency semiconductor device housing package that is manufacturable solely with a production process based on a thick film printing technique suitable for mass production and a technique for realizing a multilayer structure of dielectric layers such as ceramics, and that provides satisfactory high-frequency characteristics and has a mounting structure in which stable mounting accuracy can be obtained in a simple manner.

SUMMARY OF THE INVENTION

The invention has been devised to solve the above stated problems associated with the conventional art, and to satisfy the requirements on a high frequency semiconductor device housing package. Accordingly, an object of the invention is to provide a ball grid array-type high frequency semiconductor device housing package that is manufacturable by a thick film printing technique suitable for mass production and a multilayer technique for use with dielectric layers such as ceramics, and that provides satisfactory high-frequency characteristics and has a structure in which stable mounting accuracy can be obtained in a simple manner. Another object of the invention is to provide amounting structure for mounting the same.

The invention provides a high frequency semiconductor device housing package, comprising:

an insulating substrate having on its one surface a mounting and housing portion for mounting and housing therein a high frequency semiconductor device;

a plurality of wiring conductors that are electrically connected to an electrode of the high frequency semiconductor device, the wiring conductors being so arranged as to extend from the mounting and housing portion through another surface of the insulating substrate opposite to the one surface, the wiring conductors including a signal wiring conductor and a grounding wiring conductor;

a ball-shaped signal terminal that is arranged on the other surface of the insulating substrate, the ball-shaped signal terminal being electrically connected to the signal wiring conductor included in the wiring conductors; and a plurality of ball-shaped grounding terminals that are arranged on the other surface of the insulating substrate and electrically connected to the grounding wiring conductor included in the wiring conductors, the ball-shaped grounding terminals being arranged substantially circularly so as to surround the centered ball-shaped signal terminal.

According to the invention, on an under surface, i.e. the other surface of the insulating substrate are arranged a plurality of ball-shaped signal terminals and a plurality of ball-shaped grounding terminals that are electrically connected to the wiring conductors. The ball-shaped grounding terminals are plurally arranged substantially circularly so as to surround the centered ball-shaped signal terminal. In this construction, the ball-shaped signal terminal can be defined as a signal conductor for a coaxial line, and the ball-shaped grounding terminal can be defined as a grounding conductor for the coaxial line. Accordingly, the high-frequency signal fed from the circuit board to the ball-shaped signal terminal can be transmitted efficiently.

In the invention, it is preferable that the ball-shaped grounding terminals are arranged substantially circularly at intervals equal to or less than one quarter of a signal wavelength of a high-frequency signal.

According to the invention, by arranging the ball-shaped grounding terminals substantially circularly at intervals equal to or less than one quarter of a signal wavelength of a high-frequency signal, in a space sandwiched between the under surface of the insulating substrate of the package and the top surface of the circuit board, a high-frequency signal can be successfully prevented from leaking from the ball-shaped signal terminal to the outside of the region surrounded by the ball-shaped grounding terminals. Accordingly, the high-frequency signal fed from the circuit board to the ball-shaped signal terminal can be transmitted more efficiently.

In the invention, it is preferable that the insulating substrate has on its other surface a grounding conductor layer with a circular opening centered about the ball-shaped signal terminal, and that on the grounding conductor layer around the opening are arranged the ball-shaped grounding terminals substantially circularly.

According to the invention, the insulating substrate has on its under surface, i.e. the other surface, a grounding conductor layer with a circular opening centered about the ball-shaped signal terminal. Moreover, on the grounding conductor layer around the opening are arranged the ball-shaped grounding terminals substantially circularly. In this construction, a high-frequency signal can be effectively prevented from entering the interior of the insulating substrate by the grounding conductor layer formed on the under surface of the insulating substrate of the package and the ball-shaped grounding terminal connected thereto. Consequently, the high-frequency signal fed from the circuit board to the ball-shaped signal terminal can be transmitted far more efficiently.

In the invention, it is preferable that the insulating substrate has on its other surface a line conductor which is connected to the ball-shaped signal terminal, and that the grounding conductor layer is provided with a grounding conductor layer non-exist portion extending from the opening through the line conductor.

According to the invention, the insulating substrate has on its under surface, i.e. the other surface, a line conductor which is connected to the ball-shaped signal terminal. Moreover, the grounding conductor layer is provided with a grounding conductor layer non-exist portion extending from the opening through the line conductor. In this construction, a high-frequency signal can be effectively prevented from entering the interior of the insulating substrate, and thus the high-frequency signal fed from the circuit board to the ball-shaped signal terminal can be transmitted efficiently. Besides, by providing the line conductor connected to the ball-shaped signal terminal, it is possible to enhance the wiring flexibility in the under surface of the insulating substrate. Moreover, the line conductor is surrounded by the grounding conductor layer via the grounding conductor layer non-exist portion and is thus realized as a coplanar line. Consequently, a high-frequency signal can be transmitted satisfactorily.

In the invention, it is preferable that the opening has a radius which is set to be 0.3 times or less longer than the signal wavelength of the high-frequency signal.

According to the invention, the radius of the opening is set to be 0.3 times or less longer than the signal wavelength of the high-frequency signal. This equates to setting a cut-off frequency of the TE-11 mode to be higher than the signal frequency of the high-frequency signal in a case where the opening of the grounding conductor layer is regarded as an opening of a circular waveguide filled with a dielectric material which is identical with the material used for the insulating substrate. Accordingly, at the signal frequency band, unnecessary mode conversion into a waveguide mode can be sufficiently suppressed in the ball-shaped signal terminal, and thus the high-frequency signal fed from the circuit board to the ball-shaped signal terminal can be transmitted efficiently.

The invention further provides a mounting structure for mounting a high frequency semiconductor device housing package, comprising:

a high frequency semiconductor device housing package including: an insulating substrate having on its one surface a mounting and housing portion for mounting and housing therein a high frequency semiconductor device; a plurality of wiring conductors that are electrically connected to an electrode of the high frequency semiconductor device, the wiring conductors being so arranged as to extend from the mounting and housing portion through another surface of the insulating substrate opposite to the one surface, the wiring conductors including a signal wiring conductor and a grounding wiring conductor; a ball-shaped signal terminal that is arranged on the other surface of the insulating substrate, the ball-shaped signal terminal being electrically connected to the signal wiring conductor included in the wiring conductors; and a plurality of ball-shaped grounding terminals that are arranged on the other surface of the insulating substrate and electrically connected to the grounding wiring conductors included in the wiring conductors, the ball-shaped grounding terminals being arranged substantially circularly so as to surround the centered ball-shaped signal terminal; and a circuit board having on its one surface a signal terminal mounting pad corresponding to the ball-shaped signal terminal and a grounding conductor with a circular opening centered about the signal terminal mounting pad, wherein the high frequency semiconductor device housing package is mounted on the circuit board in such a way that the ball-shaped signal terminal is electrically connected to the signal terminal mounting pad, and that the ball-shaped grounding terminal is electrically connected to the grounding conductor.

According to the invention, the high frequency semiconductor device housing package embodying the invention is mounted on the circuit board that has on its top surface, i.e. one surface, the signal terminal mounting pad corresponding to the ball-shaped signal terminal and the grounding conductor with a circular opening centered about the signal terminal mounting pad, in such a way that the ball-shaped signal terminal and the ball-shaped grounding terminal are electrically connected to the signal terminal mounting pad and the grounding conductor, respectively. In this construction, the ball-shaped signal terminal and the signal terminal mounting pad can be defined as signal conductors for a coaxial line, and the ball-shaped grounding terminal and the grounding conductor can be defined as grounding conductors for this coaxial line. Accordingly, in the mounting area, a high-frequency signal can be prevented from entering the interior of the circuit board, and further, by the junction in the form of the coaxial line, the high-frequency signal fed from the circuit board to the ball-shaped signal terminal can be transmitted efficiently.

In the invention, it is preferable that the grounding conductor has an opening whose radius is set to be 0.3 times or less longer than the signal wavelength of the high-frequency signal.

According to the invention, the radius of the opening provided in the grounding conductor of the circuit board is set to be 0.3 times or less longer than the signal wavelength of the high-frequency signal. This equates to setting a cut-off frequency of the TE-11 mode to be higher than the signal frequency of the high-frequency signal in a case where the opening of the grounding conductor is regarded as an opening of a circular waveguide filled with a dielectric material which is identical with the material used for the circuit board. Accordingly, at the signal frequency band, unnecessary mode conversion into a waveguide mode can be sufficiently suppressed in the signal terminal mounting pad, and thus the high-frequency signal fed from the signal terminal mounting pad of the circuit board to the ball-shaped signal terminal can be transmitted efficiently.

In any of those cases stated above, by exploiting a self alignment effect, which is conventionally well known in the field of the ball-shaped terminal mounting technology, high mounting accuracy can be ensured using a simple mounting method suitable for mounting work automation, such as the collective reflow mounting method, and variation in the high frequency transmission characteristics resulting from mounting variation can be suppressed. Consequently, it is possible to achieve mounting with high mounting yields.

According to the invention, there is provided a high frequency semiconductor device housing package that is manufacturable by a thick film printing technique suitable for mass production and a multilayer technique for use with dielectric layers such as ceramics, and that provides satisfactory high-frequency characteristics and has a structure in which stable mounting accuracy can be obtained in a simple manner, and as well a mounting structure for mounting the same is also provided.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1A:
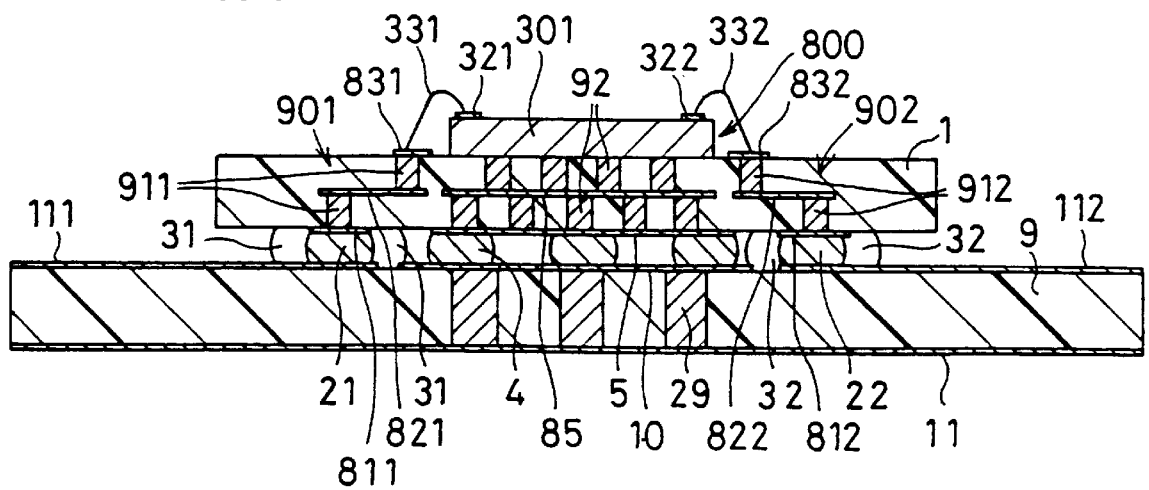
FIG. 1A is a sectional view showing a simplified structure of a high frequency semiconductor device housing package according to one embodiment of the invention.

Now referring to the drawings, preferred embodiments of the invention are described below.

Figure 1B:
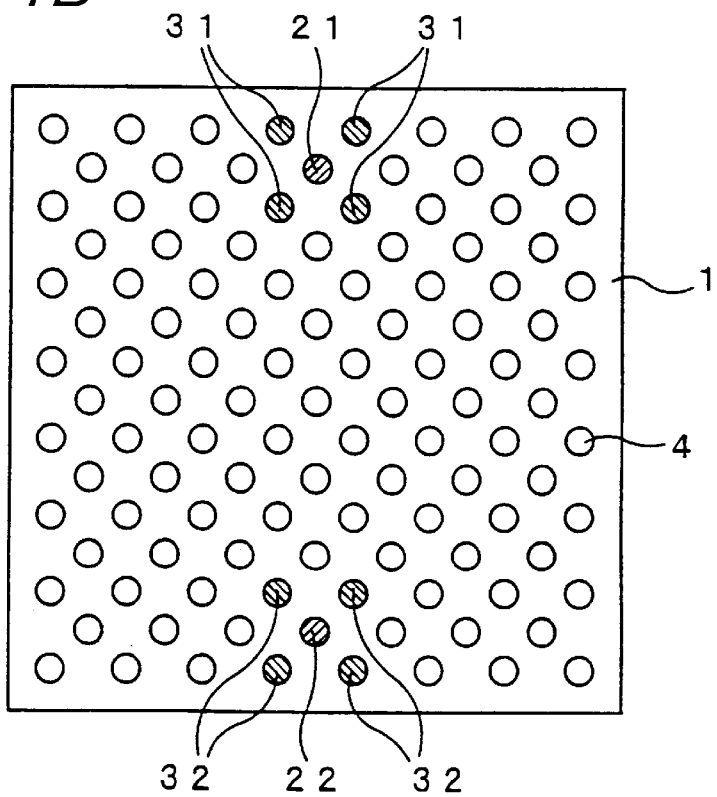
FIG. 1B is a plan view showing the high frequency semiconductor device housing package according to the embodiment of the invention.

FIG. 1A is a sectional view showing a simplified structure of a high frequency semiconductor device housing package according to one embodiment of the invention, and FIG. 1B is a plan view showing the high frequency semiconductor device housing package according to the embodiment of the invention. Numeral 1 represents an insulating substrate of the package. FIG. 1B illustrates the package as viewed from the bottom surface of the insulating substrate. Numerals 21 and 22 each represent a ball-shaped signal terminal, 31 and 32 each represent a ball-shaped grounding terminal, and 4 represents a general-purpose ball-shaped terminal for use in non-high-frequency applications such as biasing, grounding, heat transmission, or other purposes. In this embodiment, the ball-shaped grounding terminals 31, 32 are arranged substantially circularly so as to surround the centered ball-shaped signal terminal 21, 22. Specifically, the ball-shaped grounding terminals 31, 32 are arranged, in accordance with the oblique orthogonal lattice arrangement, i.e. staggered arrangement of the ball-shaped terminals, in such a way as to be located at each of vertices of a rectangular inscribed in a virtual circle about the ball-shaped signal terminal 21, 22.

More specifically, referring to FIG. 1A, the high frequency semiconductor device housing package includes the insulating substrate 1; a plurality of wiring conductors 901, 902; the ball-shaped signal terminals 21, 22; and the ball-shaped grounding terminals 31, 32. The insulating substrate 1 has on its one surface, i.e. top surface, amounting and housing portion 800 for mounting and housing therein a high frequency semiconductor device 301. The plurality of wiring conductors 901, 902 are electrically connected to electrodes 321, 322 of the high frequency semiconductor device 301 via bonding wires 331, 332, and arranged so as to extend from the mounting and housing portion 800 through the other surface, i.e. under surface, of the insulating substrate 1 opposite to the top surface.

The plurality of wiring conductors 901, 902 include signal wiring conductors 811, 821, 831, 911; and 812, 822, 832, 912 required for high-frequency signal transmission, and grounding wiring conductors required for grounding. Of the signal wiring conductors 811, 821, 831, 911; and 812, 822, 832, 912, 811 and 812 are first surface layer signal conductors disposed on the under-surface side of the insulating substrate 1; 821 and 822 are inner layer signal conductors disposed in the inner layer of the insulating substrate 1; 831 and 832 are second surface layer signal conductors disposed on the top-surface side of the insulating substrate 1 and electrically connected to the electrodes 321, 322 of the high frequency semiconductor device 301 via the bonding wires 331, 332; and 911 and 912 are signal through conductors for providing electrical connection between the first surface layer signal conductor 811, 812 and the inner layer signal conductor 821, 822 and also providing electrical connection between the inner layer signal conductor 821, 822 and the second surface layer signal conductor 831, 832. Moreover, in the inner layer of the insulating substrate 1 is formed an inner layer grounding conductor 85 which is electrically connected to the grounding electrode of the high frequency semiconductor device 301. The high frequency semiconductor device 301 and the inner layer grounding conductor 85 are electrically connected to each other by a grounding through conductor 92.

The ball-shaped signal terminal 21, 22 is disposed on the under surface of the insulating substrate 1 and electrically connected to the signal wiring conductor 811, 812 included in the plurality of wiring conductors 901, 902. The ball-shaped grounding terminal 31, 32 is disposed on the under surface of the insulating substrate 1 and electrically connected to the grounding wiring conductor included in the plurality of wiring conductors 901, 902. The ball-shaped grounding terminal 31, 32 is plurally arranged substantially circularly so as to surround the centered ball-shaped signal terminal 21, 22. In addition, on the under surface of the insulating substrate 1 are arranged a plurality of general-purpose ball-shaped terminals 4 for use in non-high-frequency applications such as biasing, grounding, heat transmission, or other purposes. These ball-shaped terminals 4, 21, 22, 31, 32 are disposed on the under surface of the insulating substrate 1 in an oblique orthogonal lattice arrangement, i.e. staggered arrangement. The ball-shaped grounding terminals 31, 32 are arranged in such a way as to be located at each of vertices of a rectangular inscribed in a virtual circle about the ball-shaped signal terminal 21, 22.

In this construction, a high-frequency signal which is supplied while being transmitted through a non-illustrated signal conductor wiring of the circuit board is then transmitted, via the ball-shaped signal terminal 21 or 22 connected to the signal terminal mounting pad formed at the front end of the signal conductor wiring, to the wiring conductor 901, 902 provided within the insulating substrate 1. In general, a grounding conductor (not shown) is formed relatively in the signal conductor wiring on the top surface of the circuit board for constituting a coplanar line or a coplanar line with a ground in it. In order for the package to be mounted on the circuit board, this grounding conductor is coupled to the ball-shaped grounding terminal 31, 32. In this way, during the transmission of a high-frequency signal by the ball-shaped terminals, the transmission mode is converted into a transmission mode such that the high-frequency signal is transmitted through a coaxial line where the ball-shaped grounding terminals 31, 32 arranged substantially circularly so as to surround the centered ball-shaped signal terminal 21, 22 are defined as outer-peripheral grounding conductors, and the ball-shaped signal terminals 21, 22 are defined as inner signal conductors. This makes it possible to achieve efficient transmission.

Moreover, by exploiting the self alignment effect, which is conventionally well known in the field of the ball-shaped terminal mounting technology, high mounting accuracy can be ensured using a simple mounting method suitable for mounting work automation, such as the collective reflow mounting method, and variation in the high-frequency transmission characteristics resulting from variation in the mounting position accuracy can be suppressed. Consequently, it is possible to achieve mounting with high mounting yields.

Figure 2:
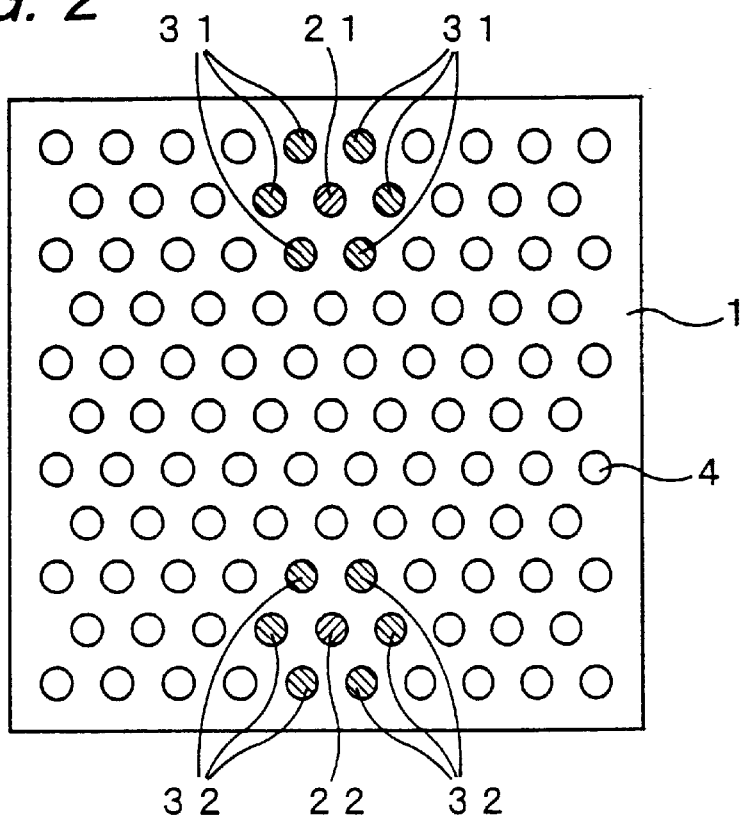
FIG. 2 is a plan view showing the high frequency semiconductor device housing package according to another embodiment of the invention.
Figure 3:
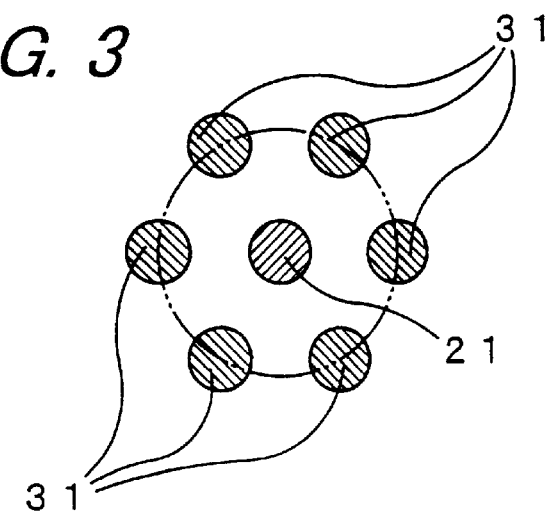
FIG. 3 is an enlarged view showing a principal portion of a high frequency transmission region in a ball-shaped terminal depicted in FIG. 2.

FIG. 2 is a plan view showing the high frequency semiconductor device housing package according to another embodiment of the invention, and FIG. 3 is an enlarged view showing the principal portion of the high frequency transmission region in the ball-shaped terminal depicted in FIG. 2.

In these figures, as in the case of FIG. 1, numeral 1 represents an insulating substrate, 21 and 22 each represent a ball-shaped signal terminal, 31 and 32 each represent a ball-shaped grounding terminal, and 4 represents a general-purpose ball-shaped terminal. In this embodiment, the ball-shaped grounding terminals 31, 32 are arranged substantially circularly so as to surround the centered ball-shaped signal terminal 21, 22. Specifically, the ball-shaped grounding terminals 31, 32 are arranged, in accordance with the oblique lattice arrangement of the ball-shaped terminals, in such a way as to be located at each of vertices of a hexagon inscribed in a virtual circle about the ball-shaped signal terminal 21, 22.

In this construction, as with the embodiment shown in FIG. 1, the transmission mode is converted into a transmission mode such that the high-frequency signal is transmitted through a coaxial line where the ball-shaped grounding terminals 31, 32 arranged substantially circularly so as to surround the centered ball-shaped signal terminal 21, 22 are defined as outer-peripheral grounding conductors, and the ball-shaped signal terminals 21, 22 are defined as inner signal conductors. This makes it possible to achieve efficient transmission. Moreover, by exploiting the self alignment effect, high mounting accuracy can be ensured, and variation in the high-frequency transmission characteristics can be suppressed, whereby making it possible to achieve mounting with high mounting yields.

Further, in this example, the interval between the adjacent ball-shaped grounding terminals 31, as well as the interval between the adjacent ball-shaped grounding terminals 32, can be easily set at a small value equal to or less than one quarter of the signal wavelength of the high-frequency signal. By arranging the ball-shaped grounding terminals 31, 32 in that way, it is possible to successfully prevent a to-be-transmitted high-frequency signal from leaking to the outside of the region surrounded by the ball-shaped grounding terminals 31, 32. Consequently, more efficient transmission can be achieved.

Figure 4:
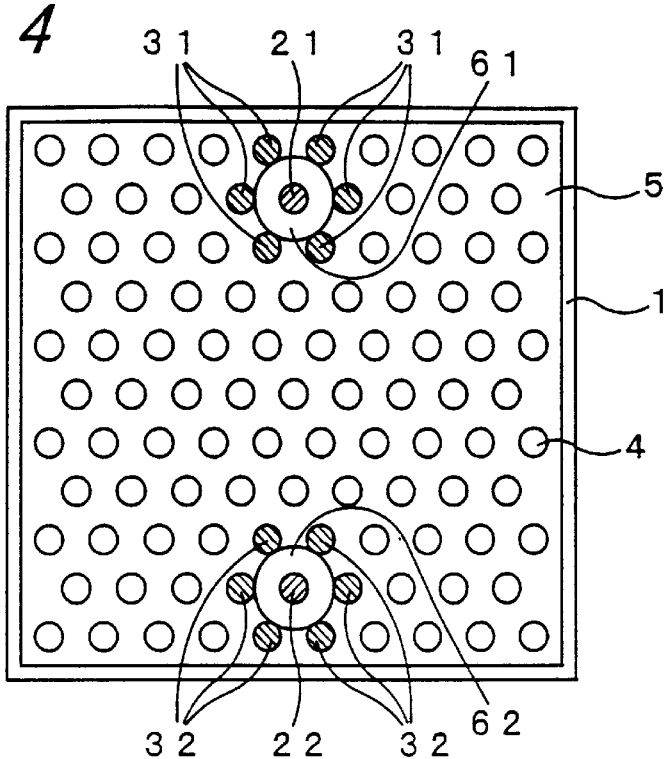
FIG. 4 is a plan view showing the high frequency semiconductor device housing package according to still another embodiment of the invention.

FIG. 4 is a plan view showing the high frequency semiconductor device housing package according to still another embodiment of the invention. In FIG. 4, as with the embodiments shown in FIGS. 1 and 2, numeral 1 represents an insulating substrate, 21 and 22 each represent a ball-shaped signal terminal, 31 and 32 each represent a ball-shaped grounding terminal, and 4 represents a general-purpose ball-shaped terminal. In this embodiment, the ball-shaped grounding terminals 31, 32 are arranged substantially in the same manner as in the example shown in FIG. 2. Moreover, numeral 5 represents a grounding conductor layer formed on the under surface of the insulating substrate 1, and 61 and 62 each represent a circular opening formed on the grounding conductor layer 5. The opening 61, 62 is shaped like a circle about the ball-shaped signal terminal 21, 22. The ball-shaped grounding terminals 31, 32 are arranged on the grounding conductor layer 5 around the opening 61, 62 substantially circularly so as to surround the centered ball-shaped signal terminal 21, 22.

More specifically, referring to FIG. 1A, the high frequency semiconductor device housing package includes the insulating substrate 1; a plurality of wiring conductors 901, 902; the grounding conductor layer 5; the ball-shaped signal terminals 21, 22; and the ball-shaped grounding terminals 31, 32. The insulating substrate 1 has on its top surface a mounting and housing portion 800 for mounting and housing therein a high frequency semiconductor device 301. The plurality of wiring conductors 901, 902 are electrically connected to electrodes 321, 322 of the high frequency semiconductor device 301 via bonding wires 331, 332, and arranged so as to extend from the mounting and housing portion 800 through the under surface of the insulating substrate 1. The plurality of wiring conductors 901, 902 include signal wiring conductors 811, 821, 831, 911; and 812, 822, 832, 912 and grounding wiring conductors.

The ball-shaped signal terminal 21, 22 is arranged on the under surface of the insulating substrate 1 and electrically connected to the signal wiring conductor 811, 812. The grounding conductor layer 5 is formed on the under surface of the insulating substrate 1 and electrically connected to the grounding wiring conductor. The grounding conductor layer 5 is provided with the circular opening 61, 62 centered about the ball-shaped signal terminal 21, 22. The opening 61, 62 has a radius set to be larger than the radius of the ball-shaped signal terminal 21, 22. The ball-shaped grounding terminal 31, 32 is disposed on the grounding conductor layer 5 around the opening 61, 62, and plurally arranged substantially circularly so as to surround the centered ball-shaped signal terminal 21, 22. Further, on the grounding conductor layer 5 are arranged a plurality of general-purpose ball-shaped terminals 4 for use in non-high-frequency applications such as biasing, grounding, heat transmission, or other purposes. These ball-shaped terminals 4, 21, 22, 31, 32 are disposed on the under surface of the insulating substrate 1 in an oblique orthogonal lattice arrangement, i.e. staggered arrangement. The ball-shaped grounding terminals 31, 32 are arranged in such a way as to be located at each of vertices of a hexagon inscribed in a virtual circle about the ball-shaped signal terminal 21, 22.

In this construction, as with the embodiments shown in FIGS. 1 and 2, the high-frequency signal transmission mode is converted into a transmission mode such that the high-frequency signal is transmitted through a coaxial line where the ball-shaped grounding terminals 31, 32 arranged substantially circularly so as to surround the centered ball-shaped signal terminal 21, 22 are defined as outer-peripheral grounding conductors, and the ball-shaped signal terminals 21, 22 are defined as inner signal conductors. This makes it possible to achieve efficient transmission. Moreover, by exploiting the self alignment effect, high mounting accuracy can be ensured, and variation in the high-frequency transmission characteristics can be suppressed, where by making it possible to achieve mounting with high mounting yields.

Further, the ball-shaped grounding terminals 31, 32 surrounding the ball-shaped signal terminal 21, 22 are mutually connected by the grounding conductor layer 5. This makes it possible to prevent the high-frequency signal supplied to the ball-shaped signal terminal 21, 22 from entering the interior of the insulating substrate 1, and thereby the wiring conductor (not shown) and the internal grounding conductor layer (not shown) can successfully be protected from adverse effects.

Figure 5:
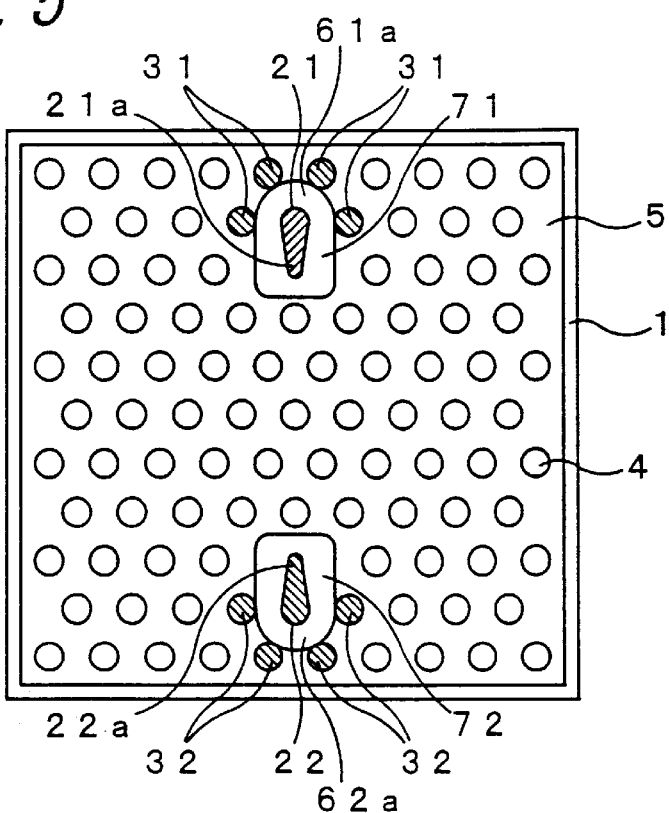
FIG. 5 is a plan view showing the high frequency semiconductor device housing package according to further another embodiment of the invention.

FIG. 5 is a plan view showing the high frequency semiconductor device housing package according to further another embodiment of the invention. In FIG. 5, as with the embodiments shown in FIGS. 1, 2, and 4, numeral 1 represents an insulating substrate, 21 and 22 each represent a ball-shaped signal terminal, 31 and 32 each represent a ball-shaped grounding terminal, 4 represents a general-purpose ball-shaped terminal, and 5 represents a grounding conductor layer. In this embodiment, the ball-shaped signal terminal 21, 22 has a line conductor 21a, 22a connected thereto. Numerals 71 and 72 each represent a grounding conductor layer non-exist portion where no grounding conductor layer 5 is formed. The grounding conductor layer non-exist portion 71, 72 is formed on the grounding conductor layer 5 so as to extend from the opening 61a, 62a, which is shaped like a circle about the ball-shaped signal terminal 21, 22, along the line conductor 21a, 22a. Besides, the ball-shaped grounding terminals 31, 32 are arranged, on the basis of the arrangements seen in the embodiments shown in FIGS. 2 and 4, as if to constitute a part of a circumference of a substantially circular shape, so that they are placed out of the line conductor 21a, 22a connected to the ball-shaped signal terminal 21, 22 and the grounding conductor layer non-exist portion 71, 72.

More specifically, referring to FIG. 1A, the high frequency semiconductor device housing package includes the insulating substrate 1; a plurality of wiring conductors 901, 902; the grounding conductor layer 5; the ball-shaped signal terminals 21, 22; and the ball-shaped grounding terminals 31, 32. The insulating substrate 1 has on its top surface a mounting and housing portion 800 for mounting and housing therein a high frequency semiconductor device 301. The plurality of wiring conductors 901, 902 are electrically connected to electrodes 321, 322 of the high frequency semiconductor device 301 via bonding wires 331, 332, and arranged so as to extend from the mounting and housing portion 800 through the under surface of the insulating substrate 1. The plurality of wiring conductors 901, 902 include signal wiring conductors 811, 821, 831, 911; and 812, 822, 832, 912 and grounding wiring conductors. The ball-shaped signal terminal 21, 22 is arranged on the under surface of the insulating substrate 1 and electrically connected to the signal wiring conductor 811, 812. The ball-shaped signal terminal 21, 22 has a line conductor 21a, 22a connected thereto. The grounding conductor layer 5 is formed on the under surface of the insulating substrate 1 and electrically connected to the grounding wiring conductor. Moreover, the grounding conductor layer 5 is provided with an opening 61a, 62a shaped like a circle about the ball-shaped signal terminal 21, 22, and a grounding conductor layer non-exist portion 71, 72 where no grounding conductor layer 5 is formed that extends from the opening 61a, 62a along the line conductor 21a, 22a. That is, the grounding conductor layer non-exist portion 71, 72 is equal to a part of the under surface of the insulating substrate 1 that is exposed from the grounding conductor layer 5. The opening 61a, 62a has a radius set to be larger than the radius of the ball-shaped signal terminal 21, 22.

The ball-shaped grounding terminal 31, 32 is disposed on the grounding conductor layer 5 around the opening 61a, 62a, and plurally arranged as if to constitute a part of a circumference of a substantially circular shape surrounding the centered ball-shaped signal terminal 21, 22, so that they are placed out of the line conductor 21a, 22a connected to the ball-shaped signal terminal 21, 22 and the grounding conductor layer non-exist portion 71, 72. On the grounding conductor layer 5 are further arranged a plurality of general-purpose ball-shaped terminals 4 for use in non-high-frequency applications such as biasing, grounding, heat transmission, or other purposes. These ball-shaped terminals 4, 21, 22, 31, 32 are disposed on the under surface of the insulating substrate 1 in an oblique orthogonal lattice arrangement, i.e. staggered arrangement. The ball-shaped grounding terminals 31, 32 are arranged in such a way as to be located at each of four opening 61a, 62a-side vertices of a hexagon inscribed in a virtual circle about the ball-shaped signal terminal 21, 22.

In this construction, as with the embodiments shown in FIGS. 1, 2, and 4, the high-frequency signal transmission mode is converted into a transmission mode such that the high-frequency signal is transmitted through a coaxial line where the ball-shaped grounding terminals 31, 32 arranged substantially circularly so as to surround the centered ball-shaped signal terminal 21, 22 are defined as outer-peripheral grounding conductors, and the ball-shaped signal terminals 21, 22 are defined as inner signal conductors. This makes possible efficient signal transmission. Moreover, by exploiting the self alignment effect, high mounting accuracy can be ensured, and variation in the high-frequency transmission characteristics can be suppressed, whereby making it possible to achieve mounting with high mounting yields.

Further, the grounding conductor layer 5 is integrally provided with the semicircular opening 61a, 62a centered about the ball-shaped signal terminal 21, 22, and the grounding conductor layer non-exist portion 71, 72 extending along the line conductor 21a, 22a connected to the ball-shaped signal terminal 21, 22. This makes it possible to enhance the wiring design flexibility in the line conductors 21a, 22a and the wiring conductors within the insulating substrate 1.

Figure 6:
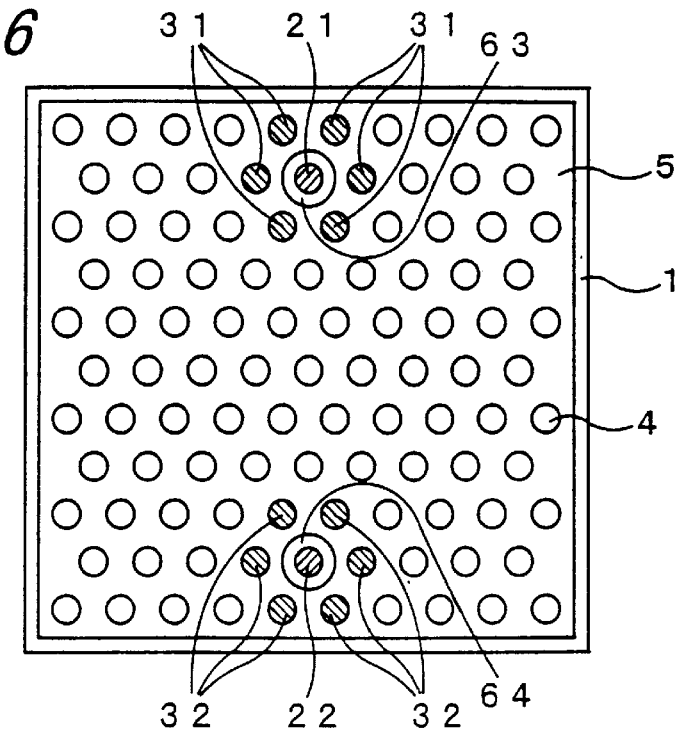
FIG. 6 is a plan view showing the high frequency semiconductor device housing package according to further another embodiment of the invention.

FIG. 6 is a plan view showing the high frequency semiconductor device housing package according to further another embodiment of the invention. In FIG. 6, as with the embodiments shown in FIGS. 1, 2, 4, and 5, numeral 1 represents an insulating substrate, 21 and 22 each represent a ball-shaped signal terminal, 31 and 32 each represent a ball-shaped grounding terminal, 4 represents a general-purpose ball-shaped terminal, 5 represents a grounding conductor layer, and 63 and 64 each represent an opening shaped like a circle about the ball-shaped signal terminal 21, 22, which is formed on the grounding conductor layer 5. In this example, the ball-shaped grounding terminals 31, 32 are arranged substantially in the same manner as the embodiments shown in FIGS. 2 and 4. In this embodiment, the radius of the opening 63, 64 is set to be larger than the radius of the ball-shaped signal terminal and 0.3 times or less longer than the signal wavelength of the high-frequency signal.

In this construction, as with the embodiments shown in FIGS. 1, 2, 4, and 5, the high-frequency signal transmission mode is converted into a transmission mode such that a high-frequency signal is transmitted through a coaxial line where the ball-shaped grounding terminals 31, 32 arranged substantially circularly so as to surround the centered ball-shaped signal terminal 21, 22 are defined as outer-peripheral grounding conductors, and the ball-shaped signal terminals 21, 22 are defined as inner signal conductors. This makes possible efficient signal transmission. Moreover, by exploiting the self alignment effect, high mounting accuracy can be ensured, and variation in the high-frequency transmission characteristics can be suppressed, whereby making it possible to achieve mounting with high mounting yields.

Incidentally, if the high-frequency signal is increased in signal frequency, a mode distribution similar to a waveguide mode can be present in the opening 63, 64 of the grounding conductor layer 5. Therefore, during the high-frequency signal is passing through the ball-shaped signal terminal 21, 22, the transmission characteristics may possibly be deteriorated due to radiation or resonance. It has been known that, at this time, a cut-off wavelength of the TE-11 mode, which is employed as a basic mode in a circular waveguide, is obtained by multiplying the radius of the section of the waveguide by 3.41. In light of this, by setting the radius of the circular opening 63, 64 to be 0.3 times or less longer than the signal wavelength of the high-frequency signal, conversion into the waveguide mode can be prevented in this region at the signal frequency band. Consequently, the high-frequency signal fed from the circuit board to the ball-shaped signal terminal can be transmitted efficiently.

Figure 7:
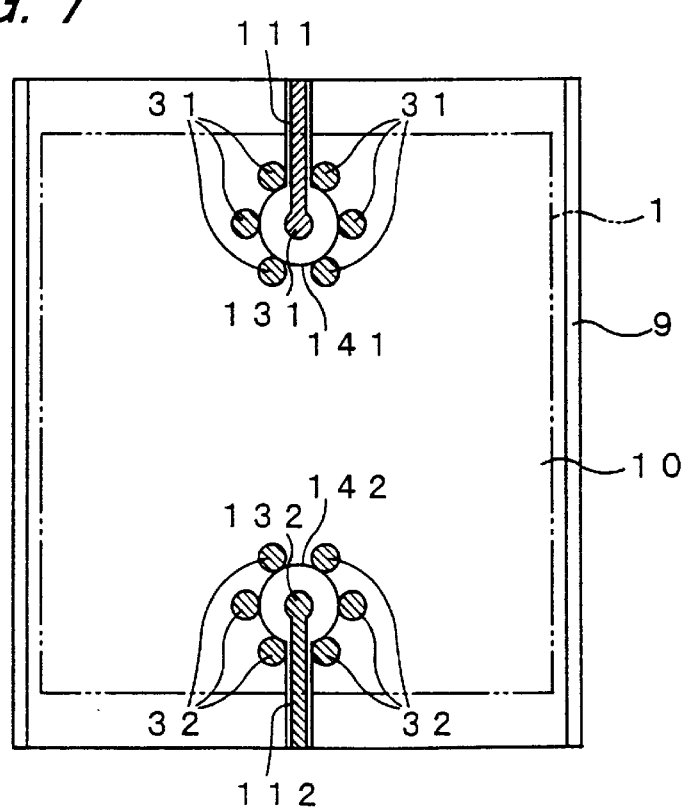
FIG. 7 is a plan view showing a circuit board on which the high frequency semiconductor device housing package embodying the invention is mounted according to one embodiment of the invention.

FIG. 7 is a plan view showing a circuit board according to one embodiment of the invention, on which the high frequency semiconductor device housing package embodying the invention is mounted to realize a mounting structure. Numeral 9 represents a circuit board, and FIG. 7 illustrates the circuit board as viewed from its top surface. Numeral 10 represents a grounding conductor formed on the top surface of the circuit board 9; 111 and 112 each represent a signal conductor wiring; 121 and 122 each represent a signal terminal mounting pad formed at a front end of the signal conductor wiring 111, 112; 131 and 132 each represent a grounding terminal mounting pad; and 141 and 142 each represent an opening shaped like a circle about the signal terminal mounting pad 121, 122, which is formed on the grounding conductor 10. Note that, although not depicted in the figure, on the grounding conductor 10 are additionally formed and arranged a biasing wiring, a biasing terminal mounting pad, and other components.

Moreover, as indicated by a dash-dot-dot line in FIG. 7, numeral 1 represents the insulating substrate of the high frequency semiconductor device housing package embodying the invention that is mounted on the circuit board 9. On the circuit board 9 is mounted any of the above-described embodiments of the high frequency semiconductor device housing package. That is, the high frequency semiconductor device housing package embodying the invention is mounted on the circuit board 9, which has on its top surface the signal terminal mounting pad 131, 132 corresponding to the ball-shaped signal terminal 21, 22 and the grounding conductor 10 including the circular opening 141, 142 centered about the signal terminal mounting pad 131, 132, in such a way that the ball-shaped signal terminal 21, 22 is electrically connected to the signal terminal mounting pad 131, 132, and that the ball-shaped grounding terminal 31, 32 is electrically connected to the grounding conductor 10. In this way, the mounting structure for mounting the high frequency semiconductor device housing package according to the invention is realized.

More specifically, referring also to FIG. 1A, the circuit board 9 has on its one surface, i.e. a top surface, the signal conductor wiring 111, 112 for achieving transmission of a high-frequency signal. At the front end of the signal conductor wiring 111, 112 is formed the signal terminal mounting pad 131, 132 for establishing electrical connection with the ball-shaped signal terminal 21, 22 of the high frequency semiconductor device housing package. On the top surface of the circuit board 9 is also formed the grounding conductor 10. The grounding conductor 10 includes the circular opening 141, 142 centered about the signal terminal mounting pad 131, 132, and is arranged on each side of the signal conductor wiring 111, 112 at a predetermined interval, so as to form a coplanar line. The opening 141, 142 is larger in radius than the signal terminal mounting pad 131, 132. The radius of the opening is so determined that the ball-shaped grounding terminal 31, 32 of the high frequency semiconductor device housing package is brought into contact and electrically connected with the grounding conductor 10 of the circuit board 9. On the under surface of the circuit board 9 is formed a grounding conductor 11. The grounding conductors 10 and 11 are electrically connected to each other by a grounding through conductor 29.

The mounting of the high frequency semiconductor device housing package on such a circuit board 9 is achieved by electrically connecting the ball-shaped signal terminal 21, 22 of the high frequency semiconductor device housing package with the signal terminal mounting pad 131, 132, and by electrically connecting the ball-shaped grounding terminal 31, 32 of the high frequency semiconductor device housing package with the grounding conductor 10 of the circuit board 9.

By mounting the high frequency semiconductor device housing package embodying the invention on the circuit board 9 thus constructed, the high-frequency signal to be transmitted by the signal conductor wiring 111, 112 of the circuit board 9 is transmitted, via the signal terminal mounting pad 121, 122 formed at the front end of the signal conductor wiring 111, 112 and the ball-shaped signal terminal 21, 22 connected thereto, to the interior of the package. At this time, since the grounding conductor 10 and the ball-shaped grounding terminal 31, 32 are coupled to each other, during a high-frequency signal is being transmitted through the ball-shaped terminal, the transmission mode is converted into a transmission mode such that a high-frequency signal is transmitted through a coaxial line where the ball-shaped grounding terminals 31, 32 arranged substantially circularly are defined as outer-peripheral grounding conductors, and the ball-shaped signal terminals 21, 22 are defined as inner signal conductors. This allows the high-frequency signal to be efficiently transmitted to the wiring conductors within the package. Thereupon, the high-frequency signal is, as described previously, inhibited from entering the interior of the package, and also inhibited from entering the interior of the circuit board 9 by dint of the grounding conductor 10.

According to the mounting structure described thus far, as has already been explained hereinabove in the description as to the high frequency semiconductor device housing package embodying the invention, by exploiting the self alignment effect, high mounting accuracy can be ensured, and variation in the high-frequency transmission characteristics can be suppressed, whereby making it possible to achieve mounting with high mounting yields.

Figure 8:
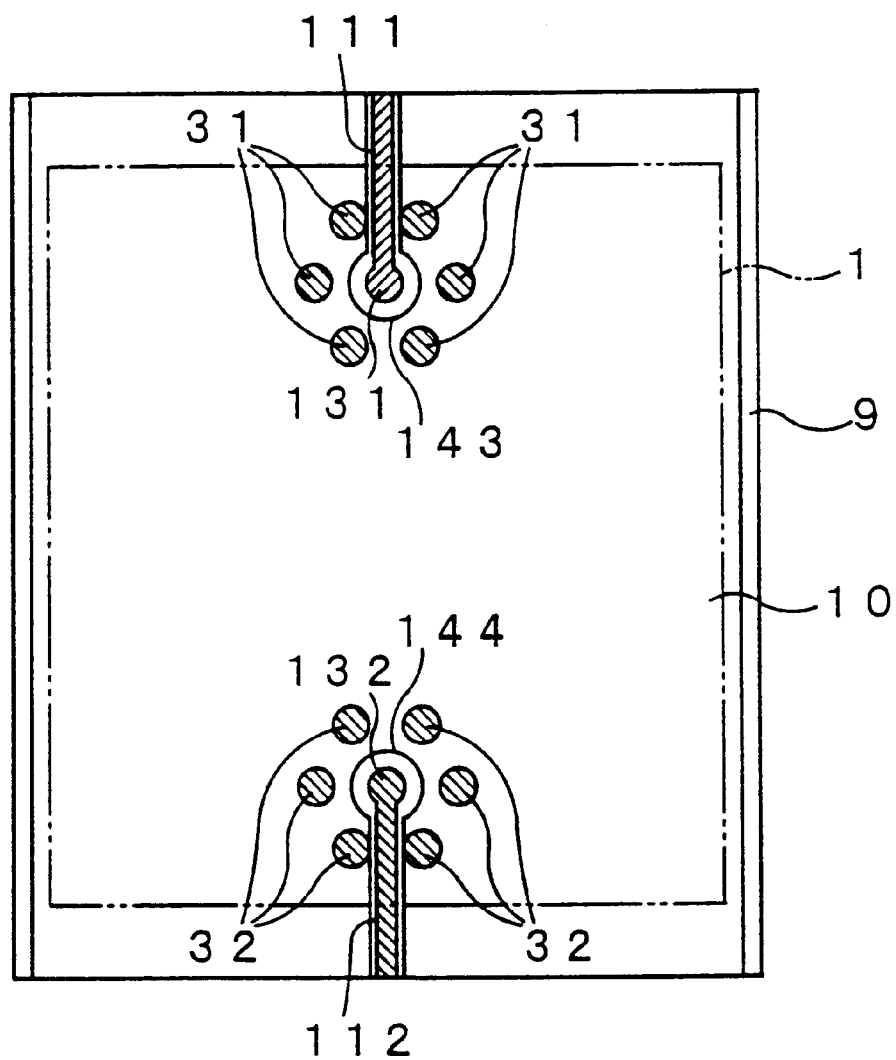
FIG. 8 is a plan view showing the circuit board on which the high frequency semiconductor device housing package embodying the invention is mounted according to another embodiment of the invention.

FIG. 8 is a plan view showing a circuit board according to another embodiment of the invention, on which the high frequency semiconductor device housing package embodying the invention is mounted to realize a mounting structure. In FIG. 8, as with the embodiment shown in FIG. 7, numeral 9 represents a circuit board; 10 represents a grounding conductor; 111 and 112 each represent a signal conductor wiring; 121 and 122 each represent a signal terminal mounting pad; 131 and 132 each represent a grounding terminal mounting pad; and 143 and 144 each represent an opening formed on the grounding conductor 10.

Moreover, as indicated by a dash-dot-dot line in FIG. 8, numeral 1 represents the insulating substrate of the high frequency semiconductor device housing package embodying the invention that is mounted on the circuit board 9. Just as in the case of the embodiment shown in FIG. 7, on the circuit board 9 is mounted any of the above-described embodiments of the high frequency semiconductor device housing package.

More specifically, referring also to FIG. 1A, the circuit board 9 has on its one surface, i.e. top surface, the signal conductor wiring 111, 112 for achieving transmission of a high-frequency signal. At the front end of the signal conductor wiring 111, 112 is formed the signal terminal mounting pad 131, 132 for establishing electrical connection with the ball-shaped signal terminal 21, 22 of the high frequency semiconductor device housing package. On the top surface of the circuit board 9 is also formed the grounding conductor 10. The grounding conductor 10 includes the circular opening 143, 144 centered about the signal terminal mounting pad 131, 132, and is arranged on each side of the signal conductor wiring 111, 112 at a predetermined interval, so as to form a coplanar line. The opening 143, 144 is larger in radius than the signal terminal mounting pad 131, 132, and the radius of the opening is set to be 0.3 times or less longer than the signal wavelength of the high-frequency signal.

The mounting of the high frequency semiconductor device housing package on such a circuit board 9 is achieved by electrically connecting the ball-shaped signal terminal 21, 22 of the high frequency semiconductor device housing package with the signal terminal mounting pad 131, 132 of the circuit board 9, and by electrically connecting the ball-shaped grounding terminal 31, 32 of the high frequency semiconductor device housing package with the grounding conductor 10 of the circuit board 9.

According to the mounting structure realized by mounting the high frequency semiconductor device housing package embodying the invention on the circuit board 9, as described above, during a high-frequency signal is being transmitted through the ball-shaped terminal, the transmission mode is converted into a transmission mode such that the high-frequency signal is transmitted through a coaxial line where the ball-shaped grounding terminals 31, 32 arranged substantially circularly are defined as outer-peripheral grounding conductors, and the ball-shaped signal terminals 21, 22 are defined as inner signal conductors. This allows the high-frequency signal to be efficiently transmitted to the wiring conductors within the package. Thereupon, the high-frequency signal is inhibited from entering the interior of the package, and also inhibited from entering the interior of the circuit board 9 by dint of the grounding conductor 10. Moreover, by exploiting the self alignment effect, high mounting accuracy can be ensured, and variation in the high-frequency transmission characteristics can be suppressed, whereby making it possible to achieve mounting with high mounting yields.

As has already been explained hereinabove in the description as to the high frequency semiconductor device housing package of the embodiment shown in FIG. 6 according to the invention, if the high-frequency signal is increased in signal frequency, a mode distribution similar to a waveguide mode can be present in the opening 143, 144 of the grounding conductor layer 10. Therefore, during the high-frequency signal is passing through the signal terminal mounting pad 121, 122, the transmission characteristics may possibly be deteriorated due to radiation or resonance. To cope with the deterioration in the transmission characteristics, in this embodiment, the radius of the circular opening 143, 144 formed on the grounding conductor 10 is set to be 0.3 times or less longer than the signal wavelength of the high-frequency signal. By doing so, in the mounting structure embodying the invention, it is possible to suppress conversion into the waveguide mode in this region at the signal frequency band. Consequently, the high-frequency signal fed from the circuit board 9 to the ball-shaped signal terminal via the signal terminal mounting pad 121, 122 can be transmitted more efficiently.

It should be noted that the constituent components for the high frequency semiconductor device housing package embodying the invention, such as the insulating substrate; the mounting and housing portion for mounting and housing therein a high frequency semiconductor device disposed on the top surface of the insulating substrate; the wiring conductor; the ball-shaped signal terminal; the ball-shaped grounding terminal; the grounding conductor layer; and the line conductor, as well as the circuit board on which the package is mounted; and the signal terminal mounting pad, the grounding terminal mounting pad, the grounding conductor, and the signal conductor wiring that are formed on the circuit board, may be formed in suitable shapes and dimensions using conventionally-known materials and fabrication techniques, and there is no particular limitation thereon.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high frequency semiconductor device housing package, comprising:
   an insulating substrate having on its one surface a mounting and housing portion for mounting and housing therein a high frequency semiconductor device;
   a plurality of wiring conductors that are electrically connected to an electrode of the high frequency semiconductor device, the wiring conductors being so arranged as to extend from the mounting and housing portion through another surface of the insulating substrate opposite to the one surface, the wiring conductors including a signal wiring conductor and a grounding wiring conductor;
   a ball-shaped signal terminal that is arranged on the other surface of the insulating substrate, the ball-shaped signal terminal being electrically connected to the signal wiring conductor included in the wiring conductors; and
   a plurality of ball-shaped grounding terminals that are arranged on the other surface of the insulating substrate and electrically connected to the grounding wiring conductor included in the wiring conductors, the ball-shaped grounding terminals being arranged substantially circularly so as to surround the centered ball-shaped signal terminal.

2. The high frequency semiconductor device housing package of claim 1,
   wherein the ball-shaped grounding terminals are arranged substantially circularly at intervals equal to or less than one quarter of a signal wavelength of a high-frequency signal.

3. The high frequency semiconductor device housing package of claim 2,
   wherein the insulating substrate has on its other surface a grounding conductor layer with a circular opening centered about the ball-shaped signal terminal,
   and wherein on the grounding conductor layer around the opening are arranged the ball-shaped grounding terminals substantially circularly.

4. The high frequency semiconductor device housing package of claim 3,
   wherein the insulating substrate has on its other surface a line conductor which is connected to the ball-shaped signal terminal,
   and wherein the grounding conductor layer is provided with a grounding conductor layer non-exist portion extending from the opening through the line conductor.

5. The high frequency semiconductor device housing package of claim 4,
   wherein the opening has a radius which is set to be 0.3 times or less longer than the signal wavelength of the high-frequency signal.

6. The high frequency semiconductor device housing package of claim 3,
   wherein the opening has a radius which is set to be 0.3 times or less longer than the signal wavelength of the high-frequency signal.

7. The high frequency semiconductor device housing package of claim 1,
   wherein the insulating substrate has on its other surface a grounding conductor layer with a circular opening centered about the ball-shaped signal terminal,
   and wherein on the grounding conductor layer around the opening are arranged the ball-shaped grounding terminals substantially circularly.

8. The high frequency semiconductor device housing package of claim 7,
   wherein the insulating substrate has on its other surface a line conductor which is connected to the ball-shaped signal terminal,
   and wherein the grounding conductor layer is provided with a grounding conductor layer non-exist portion extending from the opening through the line conductor.

9. The high frequency semiconductor device housing package of claim 8,
   wherein the opening has a radius which is set to be 0.3 times or less longer than the signal wavelength of the high-frequency signal.

10. The high frequency semiconductor device housing package of claim 7,
    wherein the opening has a radius which is set to be 0.3 times or less longer than the signal wavelength of the high-frequency signal.

11. A mounting structure for mounting a high frequency semiconductor device housing package, comprising:
    a high frequency semiconductor device housing package including:
    an insulating substrate having on its one surface a mounting and housing portion for mounting and housing therein a high frequency semiconductor device; a plurality of wiring conductors that are electrically connected to an electrode of the high frequency semiconductor device, the wiring conductors being so arranged as to extend from the mounting and housing portion through another surface of the insulating substrate opposite to the one surface, the wiring conductors including a signal wiring conductor and a grounding wiring conductor; a ball-shaped signal terminal that is arranged on the other surface of the insulating substrate, the ball-shaped signal terminal being electrically connected to the signal wiring conductor included in the wiring conductors; and a plurality of ball-shaped grounding terminals that are arranged on the other surface of the insulating substrate and electrically connected to the grounding wiring conductors included in the wiring conductors, the ball-shaped grounding terminals being arranged substantially circularly so as to surround the centered ball-shaped signal terminal; and
    a circuit board having on its one surface a signal terminal mounting pad corresponding to the ball-shaped signal terminal and a grounding conductor with a circular opening centered about the signal terminal mounting pad, wherein the high frequency semiconductor device housing package is mounted on the circuit board in such a way that the ball-shaped signal terminal is electrically connected to the signal terminal mounting pad, and that the ball-shaped grounding terminal is electrically connected to the grounding conductor.

12. The mounting structure for mounting a high frequency semiconductor device housing package of claim 11, wherein the grounding conductor of the circuit board has an opening whose radius is set to be 0.3 times or less longer than the signal wavelength of the high-frequency signal.

13. The mounting structure for mounting a high frequency semiconductor device housing package of claim 12, wherein the insulating substrate has on its other surface a grounding conductor layer with a circular opening centered about the ball-shaped signal terminal, and wherein on the grounding conductor layer around the opening are arranged the ball-shaped grounding terminals substantially circularly.

14. The mounting structure for mounting a high frequency semiconductor device housing package of claim 13, wherein the insulating substrate has on its other surface a line conductor which is connected to the ball-shaped signal terminal, and wherein the grounding conductor layer is provided with a grounding conductor layer non-exist portion extending from the opening through the line conductor.

15. The mounting structure for mounting a high frequency semiconductor device housing package of claim 14, wherein, in the high frequency semiconductor device housing package, the opening of the grounding conductor layer has a radius which is set to be 0.3 times or less longer than the signal wavelength of the high-frequency signal.

16. The mounting structure for mounting a high frequency semiconductor device housing package of claim 13, wherein, in the high frequency semiconductor device housing package, the opening of the grounding conductor layer has a radius which is set to be 0.3 times or less longer than the signal wavelength of the high-frequency signal.

17. The mounting structure for mounting a high frequency semiconductor device housing package of claim 11, wherein the ball-shaped grounding terminals are arranged substantially circularly at intervals equal to or less than one quarter of a signal wavelength of a high-frequency signal.

18. The mounting structure for mounting a high frequency semiconductor device housing package of claim 11, wherein the insulating substrate has on its other surface a grounding conductor layer with a circular opening centered about the ball-shaped signal terminal, and wherein on the grounding conductor layer around the opening are arranged the ball-shaped grounding terminals substantially circularly.

19. The mounting structure for mounting a high frequency semiconductor device housing package of claim 18, wherein the insulating substrate has on its other surface a line conductor which is connected to the ball-shaped signal terminal, and wherein the grounding conductor layer is provided with a grounding conductor layer non-exist portion extending from the opening through the line conductor.

20. The mounting structure for mounting a high frequency semiconductor device housing package of claim 19, wherein, in the high frequency semiconductor device housing package, the opening of the grounding conductor layer has a radius which is set to be 0.3 times or less longer than the signal wavelength of the high-frequency signal.

21. The mounting structure for mounting a high frequency semiconductor device housing package of claim 18, wherein, in the high frequency semiconductor device housing package, the opening of the grounding conductor layer has a radius which is set to be 0.3 times or less longer than the signal wavelength of the high-frequency signal.

* * * * *